(12) United States Patent
Babamir (10) Patent No.: US 12,476,342 B2
(45) Date of Patent: Nov. 18, 2025

(54) POWER DIVIDER SUPPORTING DIFFERENT NUMBERS OF OUTPUTS

(71) Applicant: Avago Technologies International Sales Pte. Limited, Singapore (SG)

(72) Inventor: Seyed Mehrdad Babamir, San Diego, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 160 days.

(21) Appl. No.: 18/536,217

(22) Filed: Dec. 11, 2023

(65) Prior Publication Data

US 2025/0192413 A1    Jun. 12, 2025

(51) Int. Cl.
*H01P 5/16*    (2006.01)
(52) U.S. Cl.
CPC ...................................... *H01P 5/16* (2013.01)
(58) Field of Classification Search
CPC ...... H01P 5/16; H03H 7/0123; H03H 7/0115; H03H 7/1708; H03H 2007/386; H03H 2210/025; H03H 2210/026; H03H 7/482
See application file for complete search history.

(56) References Cited

U.S. PATENT DOCUMENTS

| 9,100,083 | B2 | 8/2015 | Wu et al. |
| 9,899,962 | B2 | 2/2018 | Takenaka et al. |
| 10,177,722 | B2 | 1/2019 | Wang et al. |
| 10,608,313 | B2 | 3/2020 | Wang et al. |
| 10,910,714 | B2 | 2/2021 | Ku et al. |
| 11,626,854 | B2 | 4/2023 | Hogsagavi Puttaraju et al. |
| 2023/0208379 | A1 | 6/2023 | Yun et al. |

FOREIGN PATENT DOCUMENTS

| CN | 108768341 A | 11/2018 | |
| CN | 111355500 B | 11/2021 | |
| CN | 112886172 B | * 1/2022 | ................ H01P 5/12 |

(Continued)

OTHER PUBLICATIONS

Chung et al. (Jan. 22, 2004), "Power routing scheme with dual operating modes: two-way Wilkinson divider and one-way signal path, 3 pages".

(Continued)

*Primary Examiner* — Andrea Lindgren Baltzell
*Assistant Examiner* — Kimberly E Glenn
(74) *Attorney, Agent, or Firm* — Quarles & Brady LLP (57) ABSTRACT

A device configured to support different numbers of outputs. The device includes an input port configured to receive an input signal. The device also includes a first transmission line characterized by a first characteristic impedance and coupled to a first output port. A switch is configured to either connect or disconnect the first transmission line to the input port. The device also includes a second transmission line characterized by a second characteristic impedance and coupled between the input port and a second output port. A controller is configured to activate the first switch to set a two-output mode or to deactivate the first switch to set a one-output mode. The second characteristic impedance is configured to be the same as the first characteristic impedance at the two-output mode or configured to be reduced to $1/\sqrt{2}$ of the first characteristic impedance at the one-output mode.

20 Claims, 4 Drawing Sheets

(56) References Cited

FOREIGN PATENT DOCUMENTS

| CN | 114497953 A | 5/2022 | |
|---|---|---|---|
| CN | 115425381 A | 12/2022 | |
| CN | 112751536 B | 8/2023 | |
| EP | 1898523 A1 | 3/2008 | |
| EP | 3483981 A1 | 5/2019 | |
| KR | 1003-46746 B1 | 8/2002 | |
| KR | 2002-98269 Y1 | 12/2002 | |
| KR | 2004-0098857 A | 11/2011 | |
| WO | WO-2021/063302 A1 | 4/2021 | |
| WO | WO-2021134383 A1 * | 7/2021 | ............. H03H 11/36 |

OTHER PUBLICATIONS

Cho et al. (Jan. 6, 2020), "A Two-Way Wideband Active SiGe BiCMOS Power Divider/Combiner for Reconfigurable Phased Arrays With Controllable Beam Width," 12 pages.

Moloudian et al. (Mar. 14, 2023), "Design and fabrication of a Wilkinson power divider with harmonic suppression for LTE and GSM applications," 15 pages.

Fischer et al. (Mar. 29, 2022), "Power divider network for dual-fed adaptive antenna," 8 pages.

Salman et al. (Mar. 22, 2021), "Novel Wilkinson Power Divider with an Isolation Resistor on a Defected Ground Structure with Improved Isolation," 21 pages.

Edward et al. (Nov. 12, 2019) "Modified Wilkinson Power Divider with Switchable Function using PIN Diode Switches," 6 pages.

Florinel Balteanu (May 5, 2023) "Circuits for 5G RF front-end modules," 16 pages.

Olvera-Cervantes et al. (Jan. 2013), "A Wideband Quadrature Power Divider/Combiner and Its Application to an Improved Balanced Amplifier," 12 pages.

Wilkinson, "Wilkinson Power Splitters," https://www.microwaves101.com/encyclopedias/wilkinson-power-splitters , last accessed Dec. 11, 2023, 4 pages.

* cited by examiner

POWER DIVIDER SUPPORTING DIFFERENT NUMBERS OF OUTPUTS

FIELD OF INVENTION

The subject technology is directed to a device in wireless signal communication systems.

BACKGROUND OF THE INVENTION

A power divider for RF (Radio Frequency) signal communication is an essential component in RF and microwave systems designed to split an incoming RF signal into multiple equal or proportional parts while maintaining certain electrical characteristics such as impedance matching, phase balance, and isolation between the output ports. These devices play a crucial role in a variety of applications, including telecommunications, radar systems, wireless networks, and more. In some applications, RF power dividers are designed to operate within specific frequency bands, from RF to microwave frequencies, covering a wide range of applications. The choice of frequency range depends on the intended use and application requirements. Also, power dividers can have two, three, four, or more output ports, depending on the design and application needs. Common configurations include 2-way, 3-way, and 4-way dividers. In wireless signal communication fields, there is a need for a power divider to be reconfigurable for supporting different numbers of outputs which are associated with coexistence of multiple standards in the same frequency band. For example, a RF signal receiver may be designed with different modes to support both WiFi and Cellular standards. A power divider that can support different modes for flexibly splitting signal power to different outputs respectively with different signal standards is desired.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

The subject technology provides a power divider device configured to support different numbers of outputs. In an embodiment, the device includes a first transmission line characterized by a first characteristic impedance and coupled to a first output port. A switch is configured to either connect or disconnect the first transmission line to an input port. The device also includes a second transmission line characterized by a second characteristic impedance and coupled between the input port and a second output port. The second characteristic impedance is configured to be the same as the first characteristic impedance at the two-output mode to divide an input signal or configured to be $1/\sqrt{2}$ of the first characteristic impedance at the one-output mode to deliver the input signal fully to the second output port. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification, and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect of the present disclosure includes a power divider device in RF and microwave systems. The device includes an input port configured to receive an input signal. The device also includes a first output port. The device also includes a second output port. The device also includes a first transmission line characterized by a first characteristic impedance and coupled to the first output port. The device also includes a first switch configured to either connect or disconnect the first transmission line to the input port. The device also includes a second transmission line characterized by a second characteristic impedance and coupled between the input port and the second output port. The device also includes a controller configured to set a one-output mode or a two-output mode. In the two-output mode, a power of the input signal is divided between the first output port and the second output port as the first switch is activated and the second characteristic impedance is configured to be equal to the first characteristic impedance. In the one-output mode, the power of the input signal is all directed to the second output port as the first switch is deactivated and the second characteristic impedance is configured to be reduced by a factor of $1/\sqrt{2}$.

Implementations may include one or more of the following features. Each of the first output port and the second output port is associated with a load impedance. Each of the first output port and the second output port is associated with a load impedance. the device where the input port is configured to receive the input signal from an analog RF source associated with a source impedance. The two-output mode supports the first output port to deliver a first output signal for cellular application and the second output port to deliver a second output signal for WiFi application. The first transmission line may include at least two first capacitors each having a first capacitance C coupled in a serial configuration and at least one inductor having a first inductance L coupled in a shunt configuration to a node between the two capacitors, where the values of L and C are chosen based on conjugated impedance matching at each of the input port, the first output port, and the second output port. The second transmission line may include at least two variable capacitors each having a second capacitance coupled in a serial configuration and at least one variable inductor having a second inductance coupled in a shunt configuration to a node between the two variable capacitors. The second capacitance is configured to have a value of the first capacitance C when the first switch is activated and to change to a value of $\sqrt{2}C$ when the first switch is deactivated. The second inductance is configured to have a value of the first inductance L when the first switch is activated and to change to $L/\sqrt{2}$ when the first switch is deactivated. The variable capacitor may include a second capacitor having a third capacitance coupled in parallel to a switch-capacitor pair. This switch-capacitor pair includes a second switch coupled in series with a third capacitor having a fourth capacitance. The third capacitance is equal to the first capacitance C and the fourth capacitance is equal to the first capacitance C times $(\sqrt{2}-1)$. The second switch is configured to connect to the third capacitor when the first switch is deactivated in the one-output mode, and to disconnect from the third capacitor when the first switch is activated in the two-output mode. The device further may include a switch-resistor pair coupled between the first output port and the second output port. The switch-resistor pair may include a third switch coupled in series to an isolation resistor, where the third switch is configured to be deactivated when the first switch is deactivated and to be activated when the first switch is activated. The first transmission line and the second transmission line are configured to ensure conjugated matching with the source impedance at the input port and conjugated matching with the load impedance at each of the first output port and the second output port in the two-output mode. The second transmission line is configured to ensure conjugated matching with the source impedance respectively at the input port and with the load impedance at the second output port in the one-out mode. The input port is configured to receive the input signal from an analog RF source associated with a source impedance. The device where the two-output mode supports the first output port to deliver a first output signal for cellular application and the second output port to deliver a second output signal for WiFi application.

Another general aspect of the present disclosure includes a circuit for dividing signal power to different numbers of outputs. The circuit includes an input port coupled to a source associated with a source impedance. The circuit also includes a first output having a first load impedance. The circuit also includes a second output port having a second load impedance equal to the first load impedance. The circuit also includes a first transmission line configured with a first characteristic impedance and coupled to the first output port. The circuit also includes a first switch coupled between the input port and the first transmission line. The circuit also includes a second transmission line configured with a second characteristic impedance and coupled to the second output port. The circuit also includes a controller configured to activate or deactivate the first switch. The circuit also includes where, if the first switch is activated, the first transmission line and the second transmission line are configured to have the second characteristic impedance equal to the first characteristic impedance and maintain conjugate matching with the source impedance at the input port and conjugate matching with the first load impedance at each of the first output port and the second output port. The circuit also includes where, if the first switch is deactivated, the first transmission line and the second transmission line are configured to change the second characteristic impedance to $1/2$ of the first characteristic impedance and maintain conjugate matching with the source impedance at the input port and conjugate matching with the first load impedance at the second output port.

Implementations may include one or more of the following features. The first transmission line may include two first capacitors each having a first capacitance C coupled in a serial configuration and at least one inductor having a first inductance L coupled in a shunt configuration to a node between the two first capacitors, where the values of L and C are chosen based on conjugated impedance matching at each of the input port, the first output port, and the second output port. The second transmission line may include two variable capacitors each having a second capacitance coupled in a serial configuration and at least one variable inductor having a second inductance coupled in a shunt configuration to a node between the two variable capacitors, where the second capacitance is configured to vary from the first capacitance C when the first switch is activated to $\sqrt{2}C$ when the first switch is deactivated, where the second inductance is configured to be equal to the first inductance L when the first switch is activated and to vary to $L/\sqrt{2}$ when the first switch is deactivated. The variable capacitor may include a second capacitor having a third capacitance coupled in parallel to a switch-capacitor pair, the switch-capacitor pair including a second switch coupled in series to a third capacitor having a fourth capacitance. The third capacitance is equal to the first capacitance C and the fourth capacitance is equal to $C(\sqrt{2}-1)$. The second switch is configured to connect to the third capacitor when the first switch is deactivated, and to disconnect from the third capacitor when the first switch is activated. The device further may include a switch-resistor pair coupled between the first output port and the second output port. The switch-resistor pair may include a third switch coupled in series to a first resistor. The third switch is configured to disconnect from the first resistor when the first switch is deactivated and to connect to the first resistor when the first switch is activated. The first output port is configured to output a first signal in first standard with half of power of an input signal from the source and the second output port is configured to output a second signal in second standard with half of power of the input signal when the first switch is activated. The second output port is configured to output a second signal in the second standard with full power of the input signal when the first switch is deactivated.

A power divider is a passive RF component designed to efficiently distribute an incoming RF signal to multiple output ports. It operates on the principle of signal division, where the input RF signal is divided into two or more output signals, each with a fraction of the original power. In various wireless communication systems, the signal is power divided by the power divider to accommodate two independent down-conversion/demodulation paths. For some applications, a power divider that can support different numbers of output paths is needed. For example, a power divider can be implemented in a front-end module that supports both WiFi and cellular signal standards in a same frequency band. The receivers in the front-end module divide the signal between two outputs, one for each standard, in a two-output mode; or alternatively, the receivers should shut off cellular output and direct all the signal to the WiFi output in a one-output mode.

Figure 1:
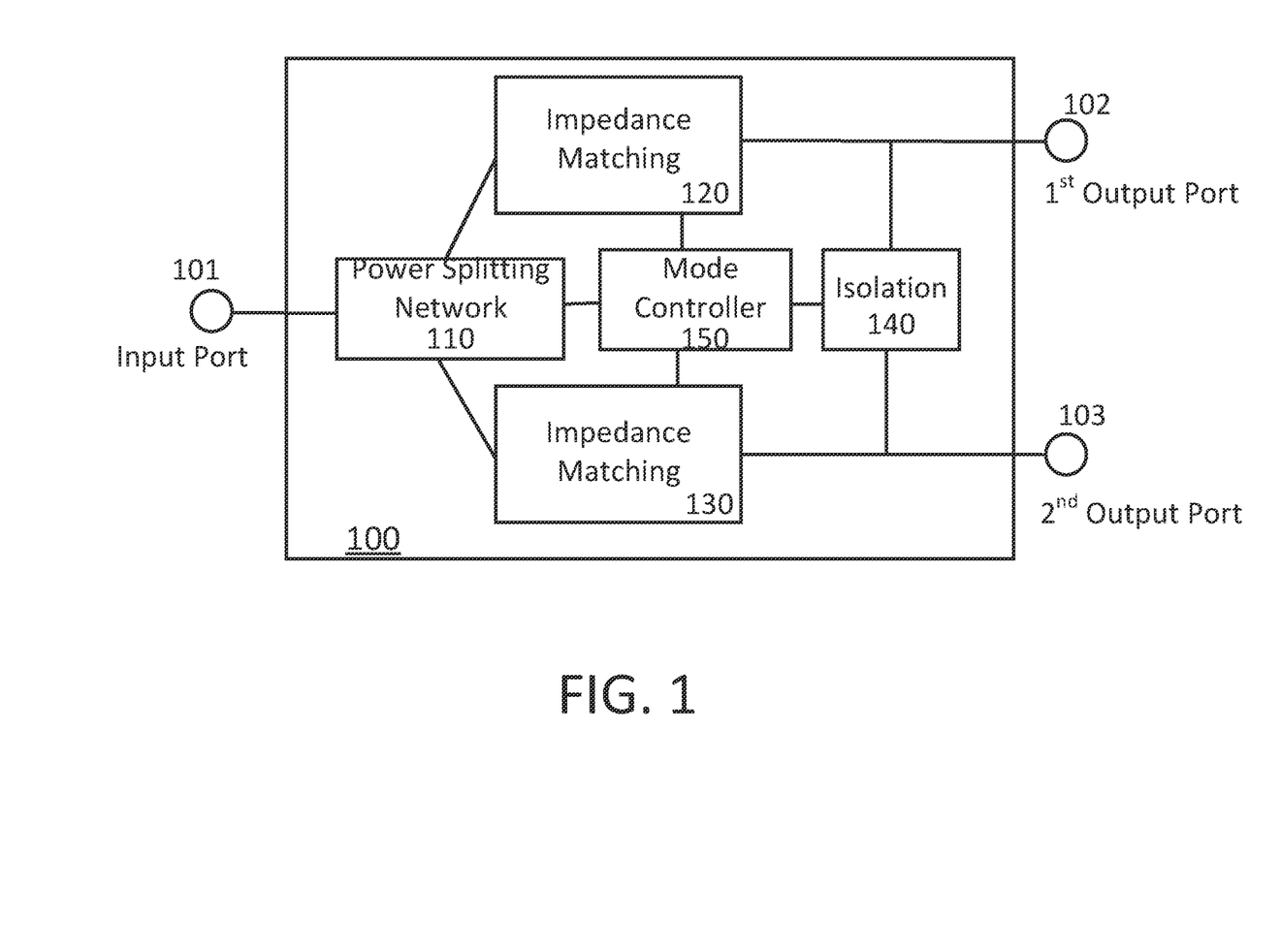
FIG. 1 depicts a power divider that can be configured to support different numbers of outputs according to some embodiments of the subject technology.

Described herein are examples related to a power divider having multiple desirable features, including reconfigurability to support different numbers of outputs which supports coexistence of multiple standards in the same frequency band, such as WiFi and cellular. FIG. 1 depicts a power divider 100 that can be configured to support different numbers of outputs according to some embodiments of the subject technology. In some embodiments, such power divider device 100 can include three ports, input port 101, first output port 102, second output port 103, where a signal to be divided can be provided at the input port 101, and two split signals can be output at the first output port 102 and the second output port 103. The power divider 100 may include a power splitting network 110, which divides the input signal into multiple output signals and respectively deliver them to (two) different paths. In some embodiments, the design of this network can vary and may include components like resistive elements, transformers, transmission lines, or couplers, depending on the type of power divider (e.g., Wilkinson, resistive, ferrite). To ensure proper impedance matching between the input and output ports, the power divider 100 also includes impedance matching components 120 and 130 in respective paths. These impedance matching components may be provided by baluns, transformers, or transmission line-based matching networks. The impedance match may be established for each signal path and particularly at the input port 101 and each output port (102, 103). This helps minimize signal reflections and optimize power transfer. Depending on the design and application, the power divider 100 may include isolation components 140 such as isolation resistors, transformers, or filters to reduce signal leakage or interference between the output ports. In particular for the feature of supporting different numbers of outputs, the power divider 100 may include a controller 150 for configuring different modes of operations. For example, one mode corresponds to a normal mode such that the power divider 100 split the input power to respectively the first output port and the second output port 103, while, another mode corresponds to an one-output mode such that the power divider 100 merely transfer the input power only to one (e.g., the second) output port 103. The controller provides the power divider 100 a feature that is self-reconfigurable between the two modes of operation.

Figure 2:
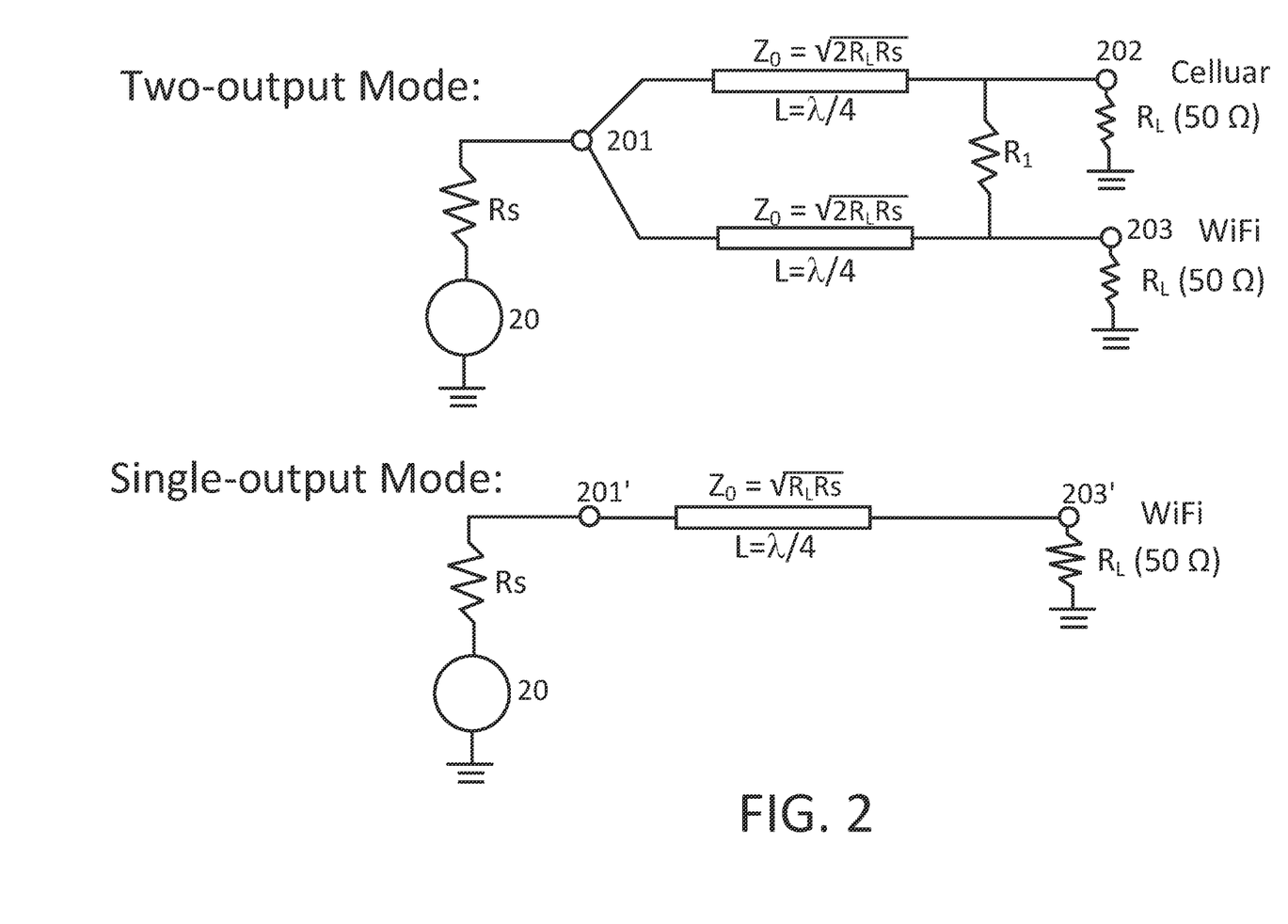
FIG. 2 shows two modes of operation by the power divider in a specific embodiment of the subject technology.

FIG. 2 shows two modes of operation by the power divider in a specific embodiment of the subject technology. For the normal mode (e.g., two-output mode), the power divider is provided in a simple example of a Wilkinson power divider with passive components for dividing the signal between WiFi and cellular outputs. In this example, the input port 201 is coupled to a source 20 to receive an input signal. The source 20 is characterized by a source impedance Rs. In its simplest form, the Wilkinson divider featured with two equal-amplitude outputs has its two arms configured as two quarter-wavelength transmission lines each terminated with a resistance $R_L$. The characteristic impedance of each quarter-wavelength transmission line is $Z_0=2\times Rs\times R_L$. Accordingly, all three ports, the input port 201, the first output port 202, and the second output port 203 are impedance matched and the power of input signal received at the input port 201 is split equally to the first output port 202 and the second output port 203. An isolation resistor $R_1$ may be used to couple between the first output port 202 and the second output port 203 to prevent signal interference between the two paths. In a specific implementation, the termination resistance $R_L$ is assumed to be 50Ω, the matched source impedance is also 50Ω, and the isolation resistance $R_1=2\times 50=100$Ω.

For the one-output mode, the data path (e.g., for cellular) ending at the first output port 202 must be cut off. However, disconnecting this branch disrupts the impedance matching at input port 201. To solve this issue, the remaining transmission line (e.g., for WiFi) ending at the output port 203' should take a different characteristic impedance. For matching the impedance of the WiFi line at the output port 203', a different characteristic impedance $Z_0'=\sqrt{R_L\times Rs}$ is required. Based on the demonstration of two modes of operation for such a simplified example, it shows that the reconfiguration of a 1:2 power divider to support both the two-output mode and one-output mode needs an improved approach, especially for applications that the source impedance may not be limited to be just passive source and may not simply equal to the termination impedance in general.

Figure 3:
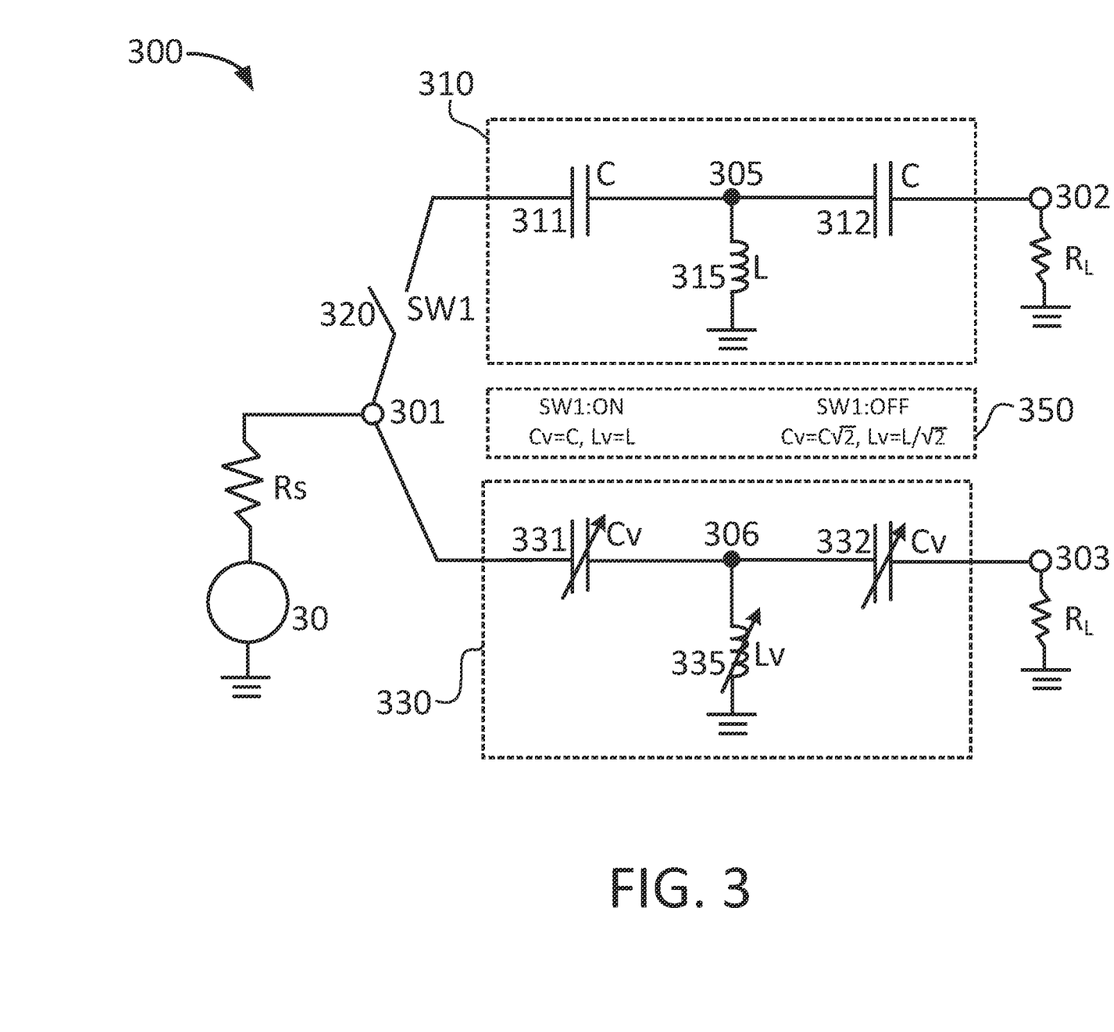
FIG. 3 shows a power divider configured to support different numbers of outputs according to some embodiments of the subject technology.

FIG. 3 shows a power divider 300 configured to support different numbers of outputs according to some embodiments of the subject technology. In an embodiment, the power divider 300 is configured to divide power of an input signal at an input port 301 to respectively a first output port 302 and a second output port 303 equally in a two-output mode and, additionally, can shut off the path from the input port 301 to the first output port 302 and only transfer the input signal to the second output port 303 with full power in an one-output mode. Optionally, the first output port 302 and the second output port 303 are designed for outputting a cellular signal and a WiFi signal respectively in the two-output mode. Optionally, the second output port 303 is designed to output only WiFi signal in the one-output mode. As shown in FIG. 3, the input port 301 receives an input signal from a source 30 which is characterized by a source impedance Rs. Each of the first output port 302 and the second output port 303 is terminated with a load impedance $R_L$. One design criterion is conjugate matching at the input port 301, i.e., the input impedance of the divider 300 needs to be matched with a conjugate of the source impedance. Also, the output impedance of the power divider 300 also needs to be matched with the load impedance at each output port. Here, the input impedance, the source impedance Rs, and the load impedance $R_L$ all are complex quantities, each including a real resistive part and an imaginary reactive part.

In the embodiment, the power splitting network (such as 110 in FIG. 1) and the impedance matching component (such as 120 and 130 in FIG. 1) of the power divider 300 are effectively combined and represented by a respective transmission line (310, 330) in each data path. In a specific embodiment, a first transmission line 310 for the data path from the input port 301 to the first output port 302 is realized by an LC-circuit. The LC-circuit in general includes at least two capacitors 311 and 312 coupled in a series configuration via a middle node 305 and at least an inductor 315 coupled in a shunt configuration (i.e., the inductor 315 is coupled between the node 305 and ground). In the embodiment, the two capacitors 311 and 312 have been assigned with a same first capacitance C and the inductor 315 is assigned with a first inductance L. Such LC-circuit has a characteristic resonance frequency $$f_0 = \frac{1}{2\pi\sqrt{LC}}$$

based on which the peaking shape can be tuned by selecting proper values of the capacitance and inductance associated with the capacitors and inductors in the LC-circuit. Essentially, the L and C are chosen by matching with both the source impedance and the termination resistance which can be achieved by setting the characteristic impedance $$Z_0 = \sqrt{\frac{L}{C}}$$

of the LC-circuit in the first transmission line 310 to $\sqrt{2\times R_L\times Rs}$.

The power divider 300 also includes a switch SW1 320 coupled between the input port 301 and one end of the first transmission line 310 which has another end coupled to the first output port 302. The switch SW1 320 is configured to be activated to connect the input port 301 and the first transmission line 310 or be deactivated to disconnect the first transmission line 310 from the input port 301. The activation of switch SW1 320 certainly enables signal path represented by the first transmission line 310 for setting the two-output mode. The deactivation of SW1 320 shuts off that data path 310 for setting the one-output mode.

In an embodiment, the power divider 300 includes a second transmission line 330 between the input port 301 and the second output port 303 to enable a second signal path. In particular, the second transmission line 330 also may be realized via a LC-circuit. This LC-circuit includes at least two variable capacitors 331 and 332 coupled in a series configuration between the input port 301 and the second output port 303 and at least one variable inductor 335 coupled in a shunt configuration between a middle node 306 (between the two variable capacitors) and the ground. The two variable capacitors, in a specific embodiment, are configured to have a same capacitance $C_v$, which is adjustable or variable to allow the impedance of the second transmission line 330 be reconfigured. Also, the variable inductor has an inductance $L_v$ which is adjustable together with the adjustment of the variable capacitance $C_v$ to achieve a desired impedance result for the second transmission line 330. Like the first transmission line 310, the LC-circuit of the second transmission line 330 is characterized by a resonance frequency $$f_0' = \frac{1}{2\pi\sqrt{L_v C_v}}$$

and a characteristic impedance $$Z_0' = \sqrt{\frac{L_v}{C_v}}.$$

The transmission spectrum peaking shape is also associated with the value of $L_v$ and $C_v$ in the resonance frequency. Additionally, the $L_v$ and $C_v$ are chosen by the impedance matching conditions depending on whether power divider 300 is in two-output mode or one-output mode.

As shown in FIG. 3, for achieving the two-output mode of the power divider 300, the switch SW1 320 is activated in an ON state to enable the first transmission line 310 between the input port 301 and the first output port 302. The second transmission line 330 between the input port 301 and the second output port 303 is always enabled. The first transmission line 310 is made by two capacitors 311 and 312 each having the first capacitance C in the series configuration and an inductor 315 having the first inductance L in the shunt configuration characterized by a characteristic impedance $$Z_0 = \sqrt{\frac{L}{C}}.$$

The second transmission line 330 is made by two variable capacitor 331 and 332 having the capacitance $C_v$ and the variable inductor 335 having the inductance $L_v$, characterized by a characteristic impedance $$Z_0' = \sqrt{\frac{L_v}{C_v}}.$$

The capacitance $C_v$ of two variable capacitors 331 and 332 need to be set equal to the first capacitance C and the inductance $L_v$ of the variable inductor 335 needs to be set equal to the first inductance L. Thus, $Z_0'=Z_0$. In addition, the L and C are chosen to meet conjugate matching at all three ports (301, 302, and 303). At the input port 301, the source impedance Rs needs to match a conjugate of an input impedance seen from the input port downstream. At each of the first/second output port 302/303, an output impedance for respective transmission line (seen from the output port upstream) needs to match a conjugate of the load impedance $R_L^*$. To achieve these impedance matching, the characteristic impedance of each path $Z_0$ is set to $\sqrt{2 \times R_L \times Rs}$. This will allow the power of the input signal be equally divided to the first and second output ports.

For achieving the one-output mode, the switch SW1 320 is deactivated in an OFF state to disconnect the first transmission line 310 from the input port 301. The power divider 300 now has only the second transmission line 330 connected between the input port 301 and the second output port 303 having a characteristic impedance $$Z_0' = \sqrt{\frac{L_v}{C_v}}.$$

To maintain conjugate matching at both the input port 301 and the (second) output port 303 for this single transmission line 330, $Z_0'$ needs to be set to $\sqrt{R_L \times Rs}$. The variable capacitors, 331 and 332, and the variable inductor 332 need to be adjusted accordingly. In the embodiment, the capacitance $C_v$ of the two variable capacitors 331 and 332 is adjusted from C to $\sqrt{2}C$ and the inductance $L_v$ of the variable inductor 335 is adjusted from L to $$\frac{1}{\sqrt{2}}L,$$

resulting in a new characteristic impedance $$Z_0' = \frac{1}{\sqrt{2}}\sqrt{\frac{L}{C}} = \frac{1}{\sqrt{2}}$$

$Z_0$ for the new second transmission line 330. These adjustments would automatically maintain the conjugate matching at both the input port 301 and the second output port 303 in the one-output mode.

In some embodiments, each of the two transmission lines (310 and 330) is not limited to be configured to a quarter-wavelength transmission line. In general, the conjugate matching at both the input port having the source impedance Rs and at each output port having the corresponding terminating impedance $R_L$. Rs and $R_L$ can be a complex number with both passive term and reactive term. Accordingly, the choice of the capacitance C ($C_v$) and inductance L ($L_v$) of the LC-circuits in respective two transmission lines are still decided by the conjugate matching. Assuming the characteristic impedance $Z_0$ has been determined to achieve the conjugate matching for the two-output mode, the characteristic impedance of the remaining transmission line needs to be adjusted to $$\frac{1}{\sqrt{2}}$$

$Z_0$ to maintain the conjugate matching for the one-output mode.

In an embodiment, the power divider 300 may include a controller 350 to make the adjustments of both $L_v$ and $C_v$. These adjustments are performed in accordance with the deactivation of switch SW1 320. Although no specific timing limitation, the two-output mode should be set by an ON state of SW1 in association with setting $C_v=C$ and $L_v=L$, and the one-output mode should be set by an OFF state of SW1 in association with setting $C_v=\sqrt{2}C$ and $$L_v = \frac{1}{\sqrt{2}}L.$$

Optionally, the controller 350 may be implemented by a hardware separated from the power divider itself or implemented in a software or firmware associated with the power splitting network.

Figure 4:
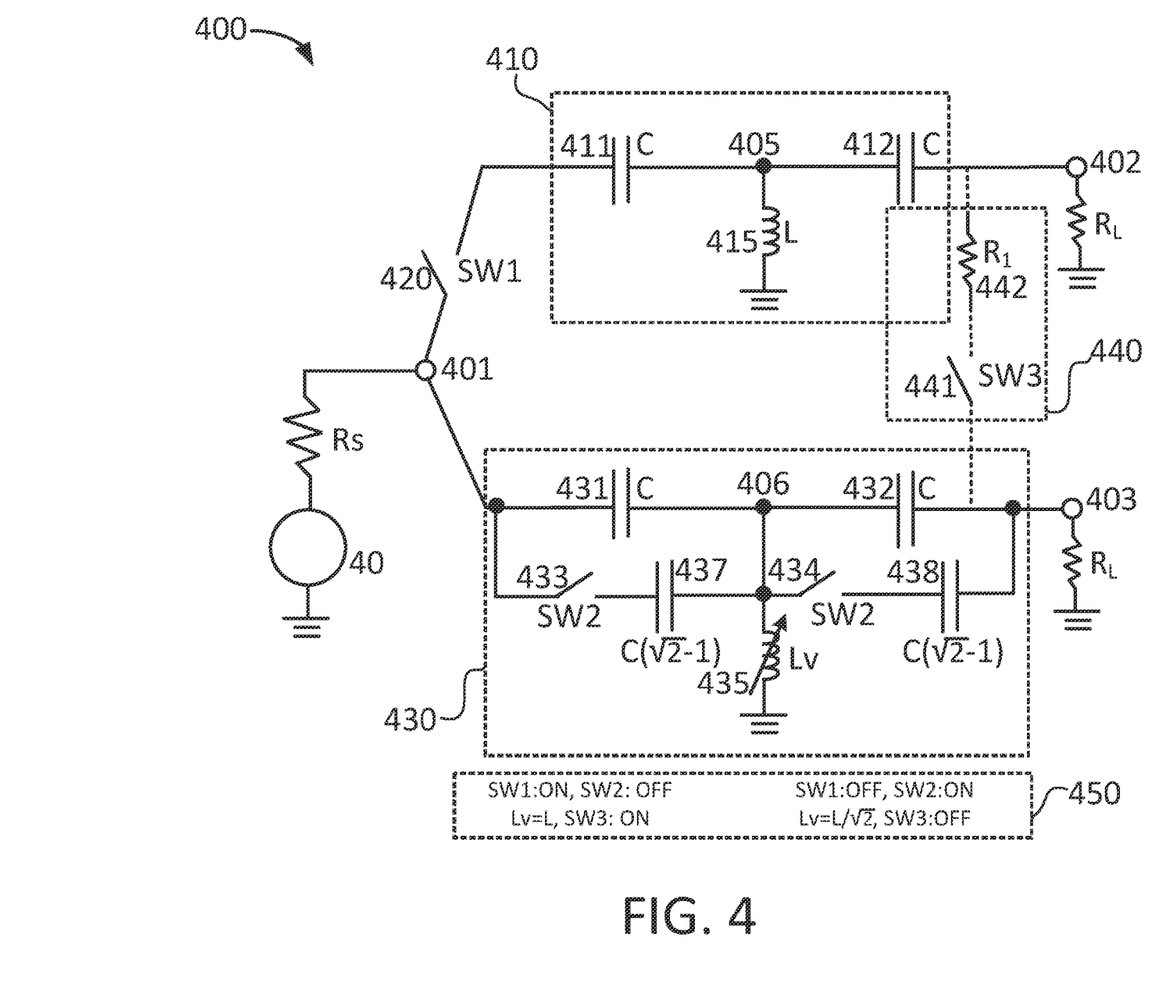
FIG. 4 shows a power divider configured to support different numbers of outputs according to a specific embodiment of the subject technology.

FIG. 4 shows a power divider 400 configured to support different numbers of outputs according to another embodiment of the subject technology. In the embodiment, the power divider 400 is configured to divide power of an input signal at an input port 401 to respectively a first output port 402 and a second output port 403 equally in a two-output mode and, additionally, can shut off the path from the input port 401 to the first output port 402 and only transfer the input signal to the second output port 303 with full power in an one-output mode. Optionally, the first output port 402 and the second output port 403 are designed for outputting a cellular signal and a WiFi signal respectively in the two-output mode. Optionally, the second output port 403 is designed to output only WiFi signal in the one-output mode. The first transmission line 410 of the power divider 400 is configured to have two capacitors 411 and 412, each having a first capacitance C, coupled in a series configuration and an inductor 415 having a first inductance L coupled in a shunt configuration to a middle node 405 between the two capacitors, substantially the same as the first transmission line 310 of the power divider 300. A first switch SW1 420 also is included, like the switch 320 in FIG. 3, to control the connection or disconnection of the first transmission line 410 to or from the input port 401. The input port 401 is coupled to a source 40 having a source impedance Rs. Each transmission line (410 or 430) is terminated having a load impedance $R_L$.

While, the second transmission line 430 is configured to have the variable capacitors (331 and 332) being reconfigured by a combination of capacitors and switches. As shown in FIG. 4, the second transmission line 430 of the power divider 400 includes two capacitors 431 and 432, each having a second capacitance C', coupled in series between the input port 401 and the second output port 403 via a middle node 406. Additionally, each capacitor 431 (or 432) is coupled to a switch-capacitor pair in parallel between the input port 401 and the middle node 406 (or between the middle node 406 and the second output port 403). The switch-capacitor pair includes a second switch SW2 433 (or 434) coupled to a capacitor 437 (or 438). The capacitor 437 (or 438) has a third capacitance C". The second transmission line 430 also includes a variable inductor 435 having adjustable inductance $L_v$ coupled in a shunt configuration to the middle node 406. The techniques implemented for realizing the variable inductor 435 are beyond the scope of this disclosure and will be a subject of another patent application from the applicant. In the embodiment, the second capacitance C' is chosen to be equal to the first capacitance C, and the third capacitance C" is chosen to be equal to the C times ($\sqrt{2}-1$).

To configure the power divider 400 for supporting different numbers of outputs, both the first switch SW1 and the two second switches SW2 are used to set the modes of operation. To set a two-output mode of the power divider 400, the first switch SW1 needs to be activated to ON state to connect the first transmission line 410 to the input port 401 to connect the first signal path from the input port 401 to the first output port 402. The first transmission line 410, as seen in FIG. 4, has be designed to have two capacitors having a capacitance C coupled in a serial configuration and an inductor 415 having an inductance L coupled (to a node 405 between the two capacitors) in a shunt configuration. Now the second transmission line 430 can be configured to have the same characteristic impedance if the second switches SW2 (433 and 434) are deactivated and the variable inductor 435 is set its inductance value $L_v$ to L so that the second signal path includes a same LC-circuit as the first transmission line 410. The values of L and C can be chosen to meet conjugate matching at all three ports (input and two outputs) having the source impedance Rs and load impedance $R_L$ being included in the design. The same LC configuration ensures an equal split of the signal power from the input port 401 to the first output port 402 and the second output port 403. While, the conjugate matching of impedance at the three ports ensures maximum power transfer and minimum reflection loss. For a mobile module designed for RF cellular signal communication as well as WiFi signal communication, the power divider as proposed can be implemented to use the first output port 402 for outputting a cellular signal and use the second output port 403 for outputting a WiFi signal in the two-output mode.

Alternatively, to configure the power divider in the one-output mode, both the first switch SW1 and two second switches SW2 are used to reconfigure the power divider 400. When the first switch SW1 is deactivated, i.e., in an OFF state, the first signal path is shut off and only the second signal path is maintained. While, at the same time, the two second switches SW2 are needed for reconfiguring the impedance of the second transmission line 430 to maintain the conjugate matching at both the input port 401 and the remaining second output port 403. In particular, the two second switches SW2 are activated when the first switch SW1 is OFF in the one-output mode. This changes the capacitor configurations in the second transmission line 430 from two parallel combination capacitors in the serial configuration. The capacitance of each parallel combination capacitor is a sum of those two capacitors, i.e., C+($\sqrt{2}-1$)C=C$\sqrt{2}$. In addition, the inductance value of variable inductor 435 needs to be reset to L/$\sqrt{2}$. By setting this LC-circuit design under the condition given by both SW1 and SW2, the power divider 400 support only one output port, i.e., the second output port 403, with all the conjugate matching conditions being maintained with the source impedance Rs at the input port 401 and matching with the load impedance $R_L$ at the second output port 403. The power divider 400 implemented the mobile module supporting both cellular and WiFi standards may just output WiFi signal only in this one-output mode.

In an embodiment, the power divider 400 may include a controller 450 configured to control the operation of the first switch SW1 420 and two second switches SW2 (433 and 434) so that the mode setting scheme can be realized as the application needs. The controller 450 may also controls the operation of the variable inductor 435 Optionally, the controller 450 is implemented together with the power divider 400 or may be implemented separately in a system controller. Optionally, the controller 450 can be implemented via software or firmware within the power divider or associated system.

In an alternative embodiment, the power divider 400 may further include a switch-resistor pair as an isolation component 440 coupled between the first output port 402 and the second output port 403. This switch-resistor pair includes a third switch SW3 441 coupled to the resistor 442 in series. The third switch SW3 may also need to be part of the whole mode setting operation for reconfiguring the power divider 400. In particular, for setting the power divider for support the two-output mode, the switch setting includes SW1:ON, SW2:OFF, SW3:ON. In the two-output mode, the isolation component 440 actually uses the resistor 442 for absorb possible interference across the two transmission lines within the operation frequency band of the power divider 400. In the one-output mode, the switch setting may include SW1: OFF, SW2: ON, SW3: OFF, as only one transmission line remains to transfer the input signal.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A device comprising:
   an input port configured to receive an input signal;
   a first output port;
   a second output port;
   a first transmission line characterized by a first characteristic impedance and coupled to the first output port;
   a first switch configured to either connect or disconnect the first transmission line to the input port;
   a second transmission line characterized by a second characteristic impedance and coupled between the input port and the second output port; and
   a controller configured to set a one-output mode or a two-output mode, wherein in the two-output mode, a power of the input signal is divided between the first output port and the second output port as the first switch is activated and the second characteristic impedance is configured to be equal to the first characteristic impedance; in the one-output mode, the power of the input signal is all directed to the second output port as the first switch is deactivated and the second characteristic impedance is configured to be reduced by a factor of $$\frac{1}{\sqrt{2}}.$$

2. The device of claim 1, wherein each of the first output port and the second output port is associated with a load impedance.

3. The device of claim 2, wherein the input port is configured to receive the input signal from an analog RF source associated with a source impedance.

4. The device of claim 1, wherein the two-output mode supports the first output port to deliver a first output signal for cellular application and the second output port to deliver a second output signal for WiFi application.

5. The device of claim 3, wherein the first transmission line comprises at least two first capacitors each having a first capacitance C coupled in a serial configuration and at least one inductor having a first inductance L coupled in a shunt configuration to a node between the two capacitors, wherein the values of L and C are chosen based on conjugated impedance matching at each of the input port, the first output port, and the second output port.

6. The device of claim 5, wherein the second transmission line comprises at least two variable capacitors each having a second capacitance coupled in a serial configuration and at least one variable inductor having a second inductance coupled in a shunt configuration to a node between the two variable capacitors, wherein the second capacitance is configured to have a value of the first capacitance C when the first switch is activated and to change to a value of $\sqrt{2}C$ when the first switch is deactivated, wherein the second inductance is configured to have a value of the first inductance L when the first switch is activated and to change to $L/\sqrt{2}$ when the first switch is deactivated.

7. The device of claim 6, wherein the variable capacitor comprises a second capacitor having a third capacitance coupled in parallel to a switch-capacitor pair, the switch-capacitor pair including a second switch coupled in series with a third capacitor having a fourth capacitance.

8. The device of claim 7, wherein the third capacitance is equal to the first capacitance C and the fourth capacitance is equal to the first capacitance C times ($\sqrt{2}-1$).

9. The device of claim 7, wherein the second switch is configured to connect to the third capacitor when the first switch is deactivated in the one output mode, and to disconnect from the third capacitor when the first switch is activated in the two-output mode.

10. The device of claim 3, further comprises a switch-resistor pair coupled between the first output port and the second output port, the switch-resistor pair comprising a third switch coupled in series to an isolation resistor, wherein the third switch is configured to be deactivated when the first switch is deactivated and to be activated when the first switch is activated.

11. The device of claim 3, wherein the first transmission line and the second transmission line are configured to ensure conjugated matching with the source impedance at the input port and conjugated matching with the load impedance at each of the first output port and the second output port in the two-output mode.

12. The device of claim 3, wherein the second transmission line is configured to ensure conjugated matching with the source impedance respectively at the input port and with the load impedance at the second output port in the one-output mode.

13. A circuit for dividing signal power to different numbers of outputs comprising:
    an input port coupled to a source associated with a source impedance;
    a first output port having a first load impedance;
    a second output port having a second load impedance equal to the first load impedance;
    a first transmission line configured to have a first characteristic impedance and coupled to the first output port;
    a first switch coupled between the input port and the first transmission line;
    a second transmission line configured to have a second characteristic impedance and coupled to the second output port; and
    a controller configured to activate or deactivate the first switch;
    wherein, if the first switch is activated, the first transmission line and the second transmission line are configured to have the second characteristic impedance equal to the first characteristic impedance and maintain conjugate matching with the source impedance at the input port and conjugate matching with the first load impedance at each of the first output port and the second output port;

wherein, if the first switch is deactivated, the first transmission line and the second transmission line are configured to change the second characteristic impedance to $$\frac{1}{\sqrt{2}}$$

of the first characteristic impedance and maintain conjugate matching with the source impedance at the input port and conjugate matching with the first load impedance at the second output port.

14. The circuit of claim 13, wherein the first transmission line comprises two first capacitors each having a first capacitance C coupled in a serial configuration and at least one inductor having a first inductance L coupled in a shunt configuration to a node between the two first capacitors, wherein the values of L and C are chosen based on the conjugated impedance matching at each of the input port, the first output port, and the second output port.

15. The circuit of claim 14, wherein the second transmission line comprises two variable capacitors each having a second capacitance coupled in a serial configuration and at least one variable inductor having a second inductance coupled in a shunt configuration to a node between the two variable capacitors, wherein the second capacitance is configured to be equal to the first capacitance C when the first switch is activated and to vary to $\sqrt{2}C$ when the first switch is deactivated, wherein the second inductance is configured to be equal to the first inductance L when the first switch is activated and to vary to $L/\sqrt{2}$ when the first switch is deactivated.

16. The circuit of claim 15, wherein the variable capacitor comprises a second capacitor having a third capacitance coupled in parallel to a switch-capacitor pair, the switch-capacitor pair including a second switch coupled in series to a third capacitor having a fourth capacitance.

17. The circuit of claim 16, wherein the third capacitance is equal to the first capacitance C and the fourth capacitance is equal to $C(\sqrt{2}-1)$.

18. The circuit of claim 16, wherein the second switch is configured to connect to the third capacitor when the first switch is deactivated, and to disconnect from the third capacitor when the first switch is activated.

19. The device of claim 13, further comprises a switch-resistor pair coupled between the first output port and the second output port, the switch-resistor pair comprising a third switch coupled in series to a first resistor, wherein the third switch is configured to disconnect from the first resistor when the first switch is deactivated and to connect to the first resistor when the first switch is activated.

20. The device of claim 13, wherein the first output port is configured to output a first signal in first standard with half of power of an input signal from the source and the second output port is configured to output a second signal in second standard with half of power of the input signal when the first switch is activated; the second output port is configured to output a second signal in the second standard with full power of the input signal when the first switch is deactivated.

* * * * *